United States Patent
Zhang et al.

(10) Patent No.: US 9,401,455 B1
(45) Date of Patent: Jul. 26, 2016

(54) ULTRAVIOLET LIGHT-EMITTING DEVICE WITH LATERAL TUNNEL JUNCTIONS FOR HOLE INJECTION

(71) Applicant: BOLB INC., San Jose, CA (US)

(72) Inventors: Jianping Zhang, San Jose, CA (US); Ling Zhou, San Jose, CA (US); Ying Gao, San Jose, CA (US)

(73) Assignee: BOLB INC., San Jose, CA (US)

( * ) Notice: Subject to any disclaimer, the term of this patent is extended or adjusted under 35 U.S.C. 154(b) by 0 days.

(21) Appl. No.: 14/973,638

(22) Filed: Dec. 17, 2015

(51) Int. Cl.
| | |
|---|---|
| H01L 33/00 | (2010.01) |
| H01L 33/32 | (2010.01) |
| H01L 33/06 | (2010.01) |
| H01L 33/24 | (2010.01) |
| H01L 33/18 | (2010.01) |
| H01L 33/14 | (2010.01) |
| H01L 33/40 | (2010.01) |

(52) U.S. Cl.
CPC .......... *H01L 33/325* (2013.01); *H01L 33/0025* (2013.01); *H01L 33/0075* (2013.01); *H01L 33/06* (2013.01); *H01L 33/145* (2013.01); *H01L 33/18* (2013.01); *H01L 33/24* (2013.01); *H01L 33/405* (2013.01)

(58) Field of Classification Search
CPC ..... H01L 33/325; H01L 33/405; H01L 33/18; H01L 33/145; H01L 33/06; H01L 33/0025; H01L 33/24; H01L 33/0075
See application file for complete search history.

(56) References Cited

U.S. PATENT DOCUMENTS

| | | | |
|---|---|---|---|
| 5,831,277 A | 11/1998 | Razeghi | |
| 6,104,039 A | 8/2000 | Asatsuma et al. | |
| 7,872,272 B2 | 1/2011 | Bour et al. | |
| 8,124,957 B2 | 2/2012 | Ibbetson et al. | |
| 8,426,225 B2 | 4/2013 | Shatalov et al. | |
| 9,293,648 B1 * | 3/2016 | Zhang | .............. H01L 33/06 |

OTHER PUBLICATIONS

Zhang, J.P., "Milliwatt power deep ultraviolet light-emitting diodes over sapphire with emission at 278 nm" Applied Physics Letters, vol. 81, No. 26, Dec. 23, 2002, pp. 4910-1912.

* cited by examiner

*Primary Examiner* — Nikolay Yushin
(74) *Attorney, Agent, or Firm* — J.C. Patents

(57) ABSTRACT

An ultraviolet light-emitting device with a lateral tunnel junction for hole injection includes a PN tunnel junction structure formed on a p-type layer at one side of an active region. The PN tunnel junction structure includes a p-type structure containing a plurality of alternately laminated p-AlGaN barrier layers and p-AlGaN well layers, and an n-type structure containing a plurality of alternately laminated n-AlGaN barrier layers and n-AlInGaN well layers, with the p-type structure facing the p-type layer. Both the p-type structure and the n-type structure have a plurality of projections extending from their surface. The n-type structure is formed on the p-type structure with the projections of the n-type structure fully filling void portions of the p-type structure.

18 Claims, 15 Drawing Sheets

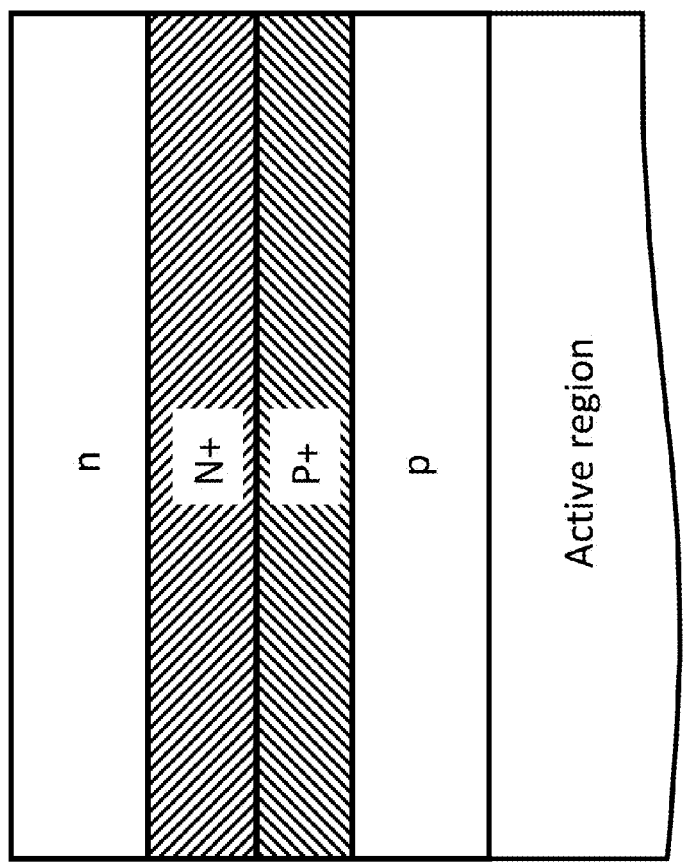

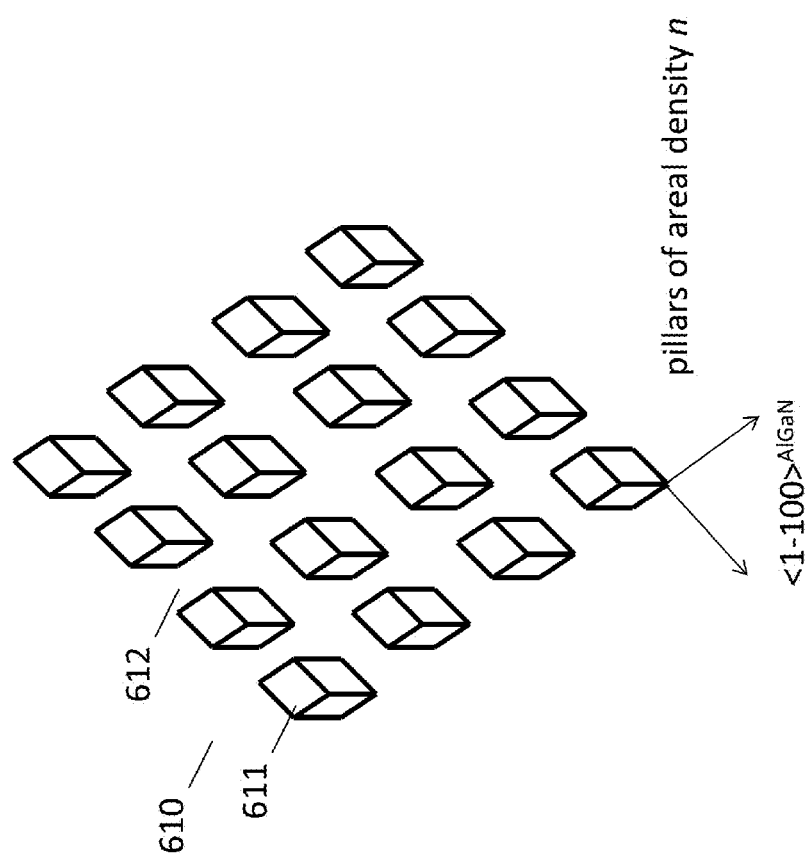

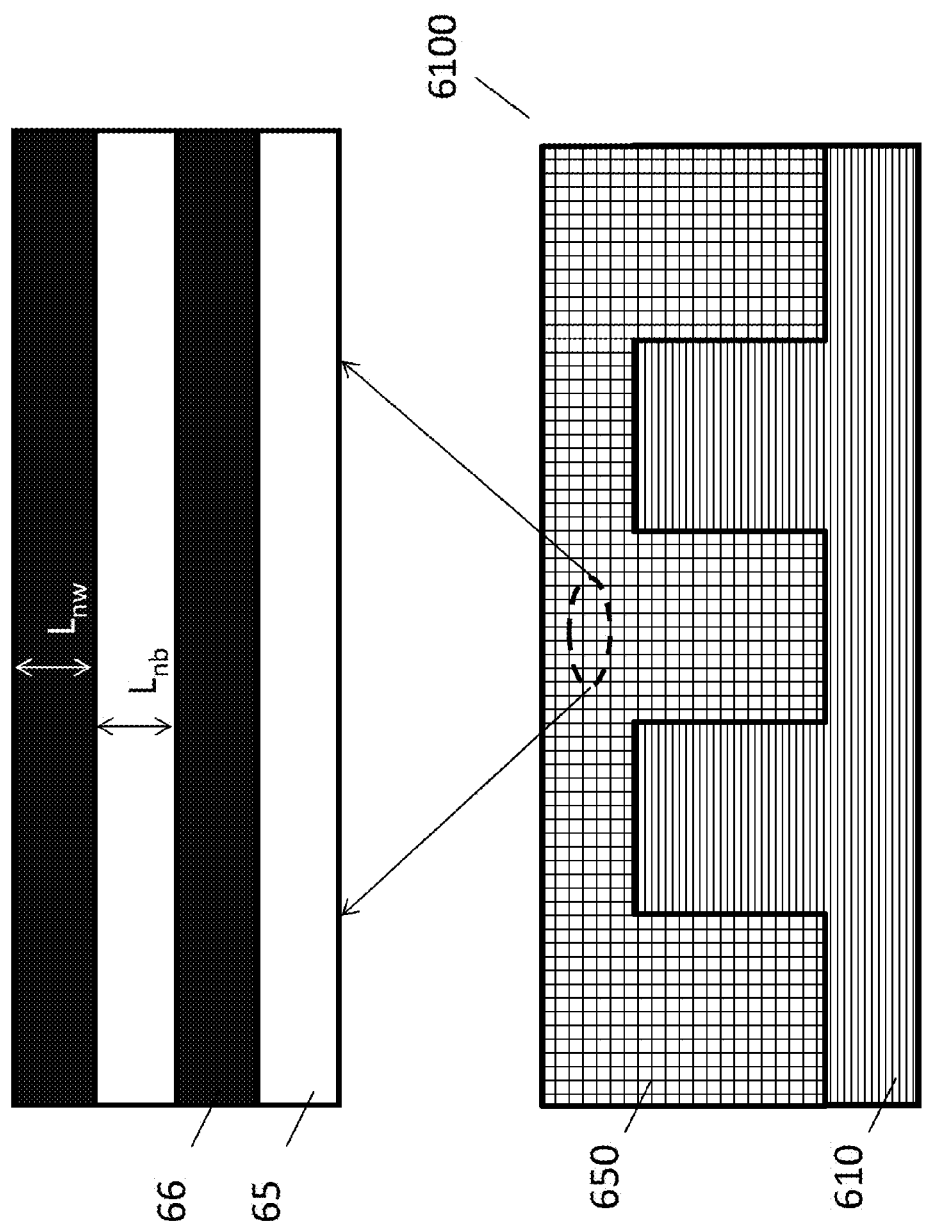

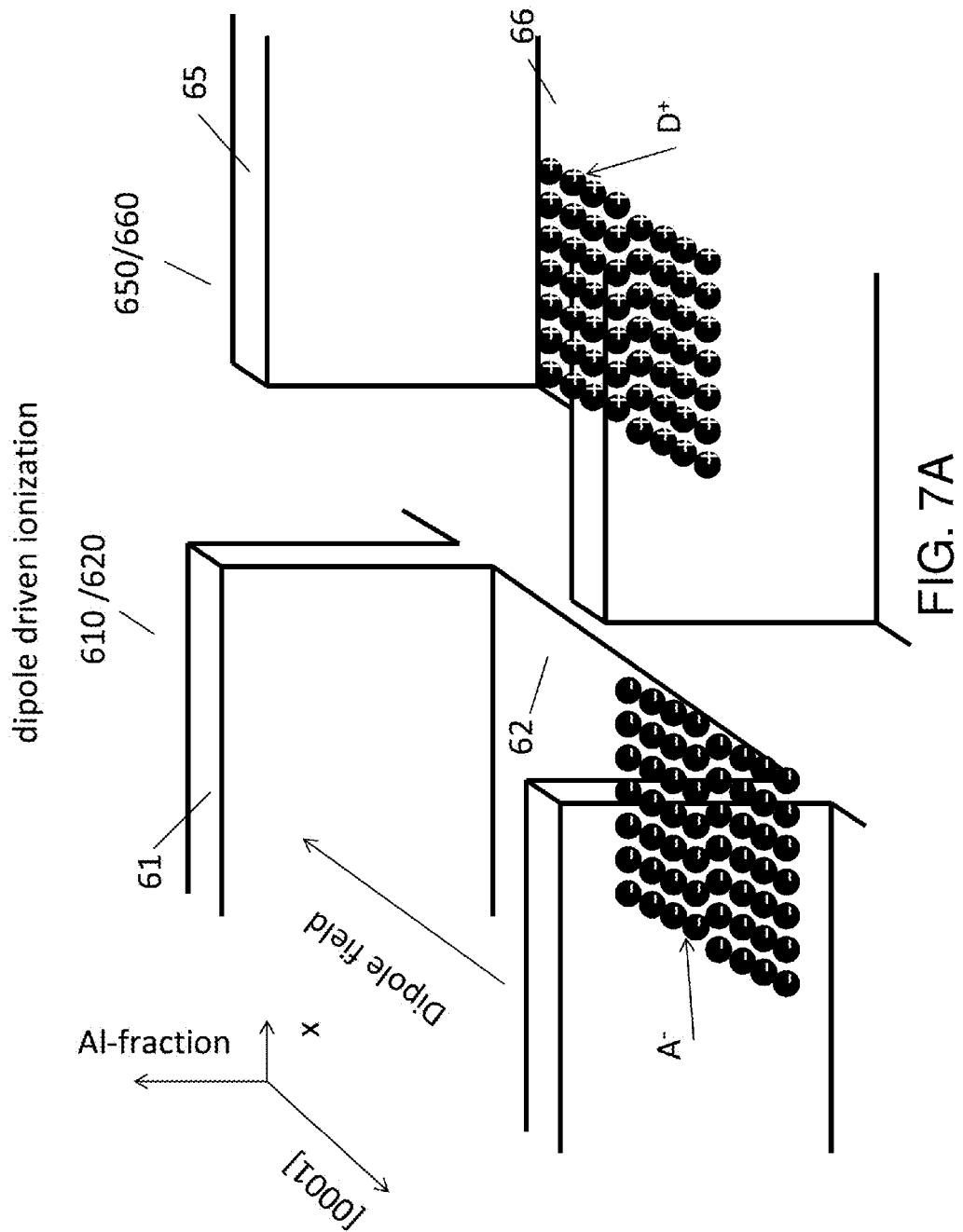

ULTRAVIOLET LIGHT-EMITTING DEVICE WITH LATERAL TUNNEL JUNCTIONS FOR HOLE INJECTION

1. FIELD OF THE INVENTION

The present invention relates in general to semiconductor light emitters with a conductive transparent hole injection structure, more particularly to group III nitride ultraviolet light emitters with conductive transparent hole injection structures of laterally formed AlGaN based PN tunnel junctions, and method of forming the same.

2. DESCRIPTION OF THE RELATED ART

Nitride compound semiconductors such as InN, GaN, AlN, and their ternary and quaternary alloys are viewed as very important optoelectronic materials. Depending on alloy composition, nitride compounds can enable ultraviolet (UV) emissions ranging from 410 nm down to approximately 200 nm. This includes UVA (400-315 nm), UVB (315-280 nm), and part of UVC (280-200 nm) regimes. UVA emissions are leading to revolutions in curing industry, and UVB and UVC emissions owing to their germicidal effect are looking forward to general adoption in food, water, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. They offer high UV light intensity and dosage, which is an ideal disinfection/sterilization treatment for fresh food, water and surface. Further, the light output of nitride UV light emitters can be modulated at high frequencies up to a few hundreds of mega-hertz, promising them to be innovative light sources for Internet of Things, covert communications and bio-chemical detections.

The state of the art UVB and UVC light-emitting diodes (LEDs) commonly adopt a laminate structure containing a c-plane sapphire as UV transparent substrate, an AlN layer coated over the substrate serving as epitaxy template, and a set of AlN/AlGaN superlattice for dislocation and strain management. The utilization of AlN template and AlN/AlGaN superlattice enables the growth of high-quality high-conductivity n-type AlGaN electron supplier layer, which injects electrons into the following AlGaN-based multiple quantum well (MQW) active-region. On the other side of the MQW active-region are an AlGaN electron-blocking layer, an AlGaN hole injection layer, a hole supplier layer and a p-type GaN or InGaN layer for ohmic contact formation. The conventional AlGaN UV LED structures can be found in the reference. (e.g., "Milliwatt power deep ultraviolet light-emitting diodes over sapphire with emission at 278 nm", J. P. Zhang, et al, APPLIED PHYSICS LETTERS 81, 4910 (2002), the content of which is incorporated herein by reference in its entirety.).

Since acceptor ionization energy increases linearly with Al-composition in AlGaN material, and hole concentration decreases exponentially with acceptor ionization energy, acceptor-doped AlGaN material (p-type AlGaN or p-AlGaN) possesses exponentially increasing electrical resistivity with Al-composition. This means conventional UV transparent p-type AlGaN layers are deemed to be highly resistive, unsuitable for serving as a hole supplier layer and p-type ohmic contact layer. In view of this obstacle, p-type GaN or InGaN layer is commonly used as hole supplier layer and ohmic contact layer in the conventional UV LEDs. Because of the strong UV absorption, the application of p-type GaN and InGaN layers severely limits the UV LED light extraction efficiency. The conventional UV LEDs emitting in the UVB and UVC regimes practically only have a light extraction efficiency as small as 6%-10%.

Superlattice structures containing p-type AlGaN barrier layers and p-type GaN well layers have been proposed to replace conventional p-type AlGaN layers for improved conductivity and preserved UV transparency (e.g. U.S. Pat. Nos. 5,831,277, 6,104,039, and 8,426,225, the contents of which are incorporated herein by reference in their entirety). The valence band and polarization discontinuities between AlGaN and GaN will lead to hole accumulation within the GaN wells. Holes can move freely within the GaN well planes, however, the AlGaN/GaN valence band and polarization discontinuities will impede hole movement in the directions perpendicular to the GaN well plane. This is to say, that the p-type AlGaN/GaN superlattice can have improved lateral conductivity yet with limited vertical conductivity, not suitable for vertical hole injection into the MQW active-region for light emissions. To enhance the vertical conductivity of the p-AlGaN/GaN superlattice, the thickness of the p-AlGaN barrier layer within the superlattice can be estimated according to hole's Bohr radius as the rule of thumb:

$$a_B = \frac{4\pi\varepsilon_r\varepsilon_0\hbar^2}{m_h e^2} = \frac{m_0}{m_h}\varepsilon_r a_{B0} = 0.529\frac{m_0}{m_h}\varepsilon_r (\text{Å})$$

since the hole's effective mass $m_h$ in AlGaN is very heavy, close to that of the free electron mass, $m_0$, and the relative permittivity $\varepsilon_r$ of AlGaN material is in-between of 8 to 9 depending on Al-composition, hole's Bohr radius within AlGaN is approximately around 5 Å. When applying such a thin AlGaN layer in the AlGaN/GaN superlattice, a) if the GaN well layer is thick enough to maintain a good AlGaN/GaN interface, the superlattice will be UV opaque; b) if the GaN well layer also maintains the ultrathin thickness for UV transparency, the ultrathin AlGaN/GaN superlattice interface will be vanishing because of interface roughness and composition mixing, which turns the ultrathin-period AlGaN/GaN superlattice identically to a conventional AlGaN alloy, losing all the hole accumulation benefit.

In U.S. Pat. Nos. 7,872,272 and 8,124,957, the contents of which are incorporated herein by reference in their entirety, a PN tunnel junction is disclosed to provide hole injection into the MQW active region (FIGS. 1A, 1B). A PN tunnel junction is known to the field of interest, formed by contacting a degenerate n-type semiconductor layer to a degenerate p-type semiconductor layer. Owing to the very high doping levels, the depletion zone in a PN tunnel junction is very thin, usually thinner than 10 nm. When a PN tunnel junction is reverse biased, electrons in the valence band of the p-type layer tunnel into the conduction band of the n-type layer. This is equal to injecting holes into the p-type layer. The tunnel current density $J_t$ is given by: $J_t = qnv_{th}T_x$, where q, n, $v_{th}$, and $T_x$ are respectively the elementary charge, available tunnel electron density in the valence band of p-layer, electron thermal velocity, and tunnel probability. Further, $$T_x = e^{-\frac{B}{E}},$$

and $$B = \frac{4(2m^*)^{\frac{1}{2}}E_g^{\frac{3}{2}}}{3q\hbar},$$

where E, $m^*$, $E_g$ and h are the average electric field within the depletion zone, electron's effective mass, band gap energy, and reduced Planck constant, respectively. As seen, the tunnel probability has an exponential dependence on the average electric field and is in reversal exponential proportion to $E_g^{1.5}$. That means tunneling in wide band gap PN junctions will be profoundly difficult.

To check the viability of the prior art disclosures, the tunnel current density of a UV transparent PN tunnel junction made of degenerate doped n-, and p-$Al_{0.5}Ga_{0.5}N$ layers is estimated. For simplicity, $J_t$ is overestimated by using the PN junction maximum electric field $E_m$ instead of the average electric field E, and n, the available tunnel electron density in the valence band is set to be $5 \times 10^{22}$ cm$^{-3}$, and $v_{th}$, the thermal velocity is calculated at room-temperature. In an abrupt PN junction, $E_m$ is related to the doping levels ($N_a$, $N_d$) via the equation:

$$E_m = \sqrt{\frac{2K_B T \ln \frac{N_a N_d}{n_i^2}}{\varepsilon\left(\frac{1}{N_a} + \frac{1}{N_d}\right)}}.$$

Here, $K_B$, T, $n_i$, and $\in$ are Boltzmann constant, temperature, intrinsic carrier density and permittivity of $Al_{0.5}Ga_{0.5}N$, respectively.

The overestimated tunnel current densities for the disclosed structures illustrated in FIG. 1A and FIG. 1B are plotted in FIG. 1C. For the structure illustrated in FIG. 1B, a dipole of $2 \times 10^6$ V/cm is adopted to enhance the tunnel probability. In the plot, the reverse bias is set to be −0.1V, and the activated acceptor concentration, $N_a$ is fixed at $10^{20}$ cm$^{-3}$, and the tunnel current densities are shown as function of activated donor concentration, $N_d$. First of all, a notable observation is that the dipole does facilitate tunneling. Secondly, if assuming a usable tunnel junction for LED operation shall at least have tunnel current density of 10 A/cm$^2$ at a reverse bias of −0.1V, the plot tells that an activated acceptor and donor concentrations of $10^{20}$ cm$^{-3}$ and $1.5 \times 10^{20}$ cm$^{-3}$ are required for the p- and n-$Al_{0.5}Ga_{0.5}N$ layers, respectively, even for the tunnel structure with help of the $2 \times 10^6$ V/cm dipole These doping and activation levels are hardly achievable for conventional high-Al-content AlGaN alloys which are UV transparent.

The present invention discloses UV transparent AlGaN PN tunnel junction structures overcoming the prior art deficiencies, and UV LEDs with such tunnel junction structures with improved light extraction efficiency.

3. SUMMARY OF THE INVENTION

An ultraviolet light-emitting device, such as an LED with a lateral tunnel junction for hole injection is provided, which has a PN tunnel junction structure formed on a p-type layer at one side of an active region. The PN tunnel junction structure includes a p-type structure containing a plurality of alternately laminated p-AlGaN barrier layers and p-AlGaN well layers, and an n-type structure containing a plurality of alternately laminated n-AlGaN barrier layers and n-AlInGaN well layers, with the p-type structure facing the p-type layer.

The p-AlGaN barrier layers have a larger Al-composition than that of the p-AlGaN well layers to ensure a valence band offset therebetween not less than 300 meV, the n-AlGaN barrier layers have a larger Al-composition than that of the n-AlInGaN well layers to ensure a conduction band offset therebetween not less than 200 meV.

The p-AlGaN barrier layers and the n-AlGaN barrier layers are respectively doped with acceptors and donors of a dopant concentration in the range of $5 \times 10^{19}$ cm$^{-3}$ to $5 \times 10^{20}$ cm$^{-3}$.

The p-type structure has a plurality of projections extending from its surface, each of the projections contains numerous alternately laminated p-AlGaN barrier layers and p-AlGaN well layers with edges of the p-AlGaN barrier layers and the p-AlGaN well layers being exposed by sidewalls of the projections.

The n-type structure has a plurality of projections extending from its surface, each of the projections contains numerous alternately laminated n-AlGaN barrier layers and n-AlInGaN well layers with edges of the n-AlGaN barrier layers and the n-AlInGaN well layers being exposed by sidewalls of the projections.

The n-AlInGaN well layers can be n-AlGaN layers or n-InGaN layers.

The n-type structure is formed on the p-type structure with the projections of the n-type structure fully filling void portions of the p-type structure, wherein the void portions of the p-type structure are defined by and surround the projections of the p-type structure.

In some embodiments, the Al-composition of the p-AlGaN barrier layers is at least 0.26 more than that of the adjacent p-AlGaN well layers, the Al-composition of the n-AlGaN barrier layers is at least 0.12 more than that of the adjacent n-AlInGaN such as n-AlGaN well layers.

The Al-composition of the p-AlGaN barrier layers is in the range of 0.66-0.8, the Al-composition of the p-AlGaN well layers is in the range of 0.4-0.5, the Al-composition of the n-AlGaN barrier layers is in the range of 0.52-0.7, and the Al-composition of the n-AlInGaN such as n-AlGaN well layers is in the range of 0.4-0.5, and the thickness of each of the p-AlGaN barrier layers and the n-AlGaN barrier layers is in the range of 3-10 nm.

The Al-composition of the p-AlGaN barrier layers is in the range of 0.75-1 and at least 0.35 more than that of the adjacent p-AlGaN well layers which is in the range of 0.4-0.65, the Al-composition of the n-AlGaN barrier layers is in the range of 0.75-1 and at least 0.35 more than that of the adjacent n-AlInGaN such n-AlGaN well layers which is in the range of 0.4-0.65. The thickness of each of the p-AlGaN barrier layers and the n-AlGaN barrier layers is in the range of 0.5-3 nm, and the thickness of each of the p-AlGaN well layers and the n-AlInGaN well layers is in the range of 6-15 nm.

In some embodiments, the p-type structure contains 50-300 pairs of the p-AlGaN barrier layers and the p-AlGaN well layers, the n-type structure contains 50-300 pairs of the n-AlGaN barrier layers and the n-AlInGaN well layers.

The height of the projections of the p-type structure can be 60-95% of a total thickness of the p-type structure, a height of the projections of the n-type sub-structure can be 60-100% of a total thickness of the n-type structure.

In some embodiments, the projections of the p-type structure have a stripe-shape and are arranged in parallel lying along $<1-100>_{AlGaN}$ direction.

In some embodiments, the projections of the p-type structure have a stripe-shape, a height of the stripe-shaped projections is in the range of 0.25-1.0 µm, a linear density of the strip-shaped projections is in the range of 2000-5000 cm$^{-1}$, a lateral size of the strip-shaped projections is in the range of 0.5-2.0 μm.

In some embodiments, a second portion of the p-AlGaN well layers is doped with Mg to a doping level in the range of 2-8×10$^{20}$ cm$^{-3}$, and a first portion of the p-AlGaN well layers is undoped or slightly doped with Mg not exceeding 3×10$^{19}$ cm$^{-3}$.

In some embodiments, a first portion of the n-AlInGaN well layers is doped with Si, and/or Ge to a doping level in the range of 1-2×10$^{20}$ cm$^{-3}$, and a second portion of the n-AlInGaN well layers is undoped or slightly doped with Si not exceeding 3×10$^{18}$ cm$^{-3}$.

In some embodiments, the Al-composition of the p-AlGaN barrier layers is at least 0.26 more than that of the adjacent p-AlGaN well layers, the Al-composition of the n-AlGaN barrier layers is in the range of 0-0.6, such as 0.1-0.3, the n-AlInGaN well layers are InGaN layers with an In-composition in the range of 0.05-0.2.

The thickness of each p-AlGaN barrier layer and each n-AlGaN barrier layer can be in the range of 0.5-10 nm.

An InGaN layer can be formed between the p-type structure and the n-type structure, the InGaN layer has a thickness in the range of 0.8-1.0 nm, an In-composition in the range of 0.15-0.2, and a Si-doping concentration of 0.1-1.5×10$^{20}$ cm$^{-3}$.

The thickness of the PN tunnel junction structure in device growth direction can be in the range of 400-4000 such as 500-3000 nanometers.

The ultraviolet light-emitting device may further include:
an n-AlGaN layer for electron supplier;
a heavily doped n-AlGaN layer for active-region polarization field screening, which is formed over the n-AlGaN layer for electron supplier, wherein the n-type layer is a lightly doped n-AlGaN layer for current spreading and formed over the heavily doped n-AlGaN layer for active-region polarization field screening, wherein the p-type layer is an electron blocking p-AlGaN layer formed over the active-region;
an n-contact layer is formed on and in ohmic contact with an n-side of the PN tunnel junction structure;
a metal mirror formed over the n-contact layer; and
a metal contact layer formed over the metal mirror.

A UV transparent dielectric layer can be embedded in the n-contact layer and exposed to the metal mirror, and the UV transparent dielectric layer and the metal mirror form an omnidirectional reflector.

4. BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 1A illustrates a prior art PN tunnel junction for nitride UV LED hole injection FIG. 1B illustrates a prior art PN tunnel junction for nitride LED hole injection.

FIG. 1C plots the overestimated tunnel current density as function of activated donor concentration for two prior art Al$_{0.5}$Ga$_{0.5}$N PN tunnel homo-junctions.

FIG. 4B illustrates a bird's eye view of a textured p-type AlGaN structure made from the p-AlGaN structure shown in FIG. 2.

FIG. 5 illustrates a cross sectional schematic view of a PN tunnel junction formed according to an embodiment of the present invention.

FIG. 5i shows an enlarged part of the n-AlGaN structure used to form the PN tunnel junction shown in FIG. 5, to illustrate the detailed structure of the n-AlGaN structure.

Figure 6:
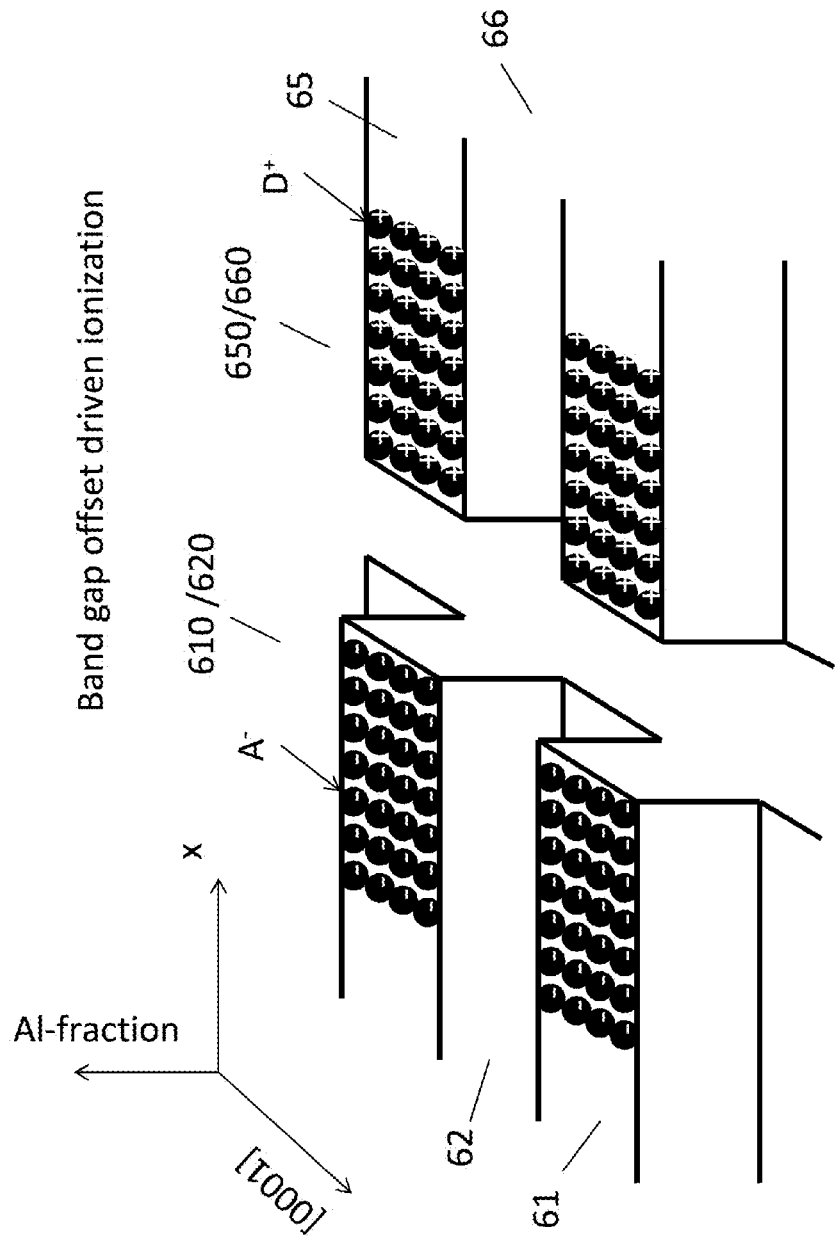

FIG. 6 explains one principle used to form the AlGaN PN tunnel junctions according to the present invention.

Figure 7B:
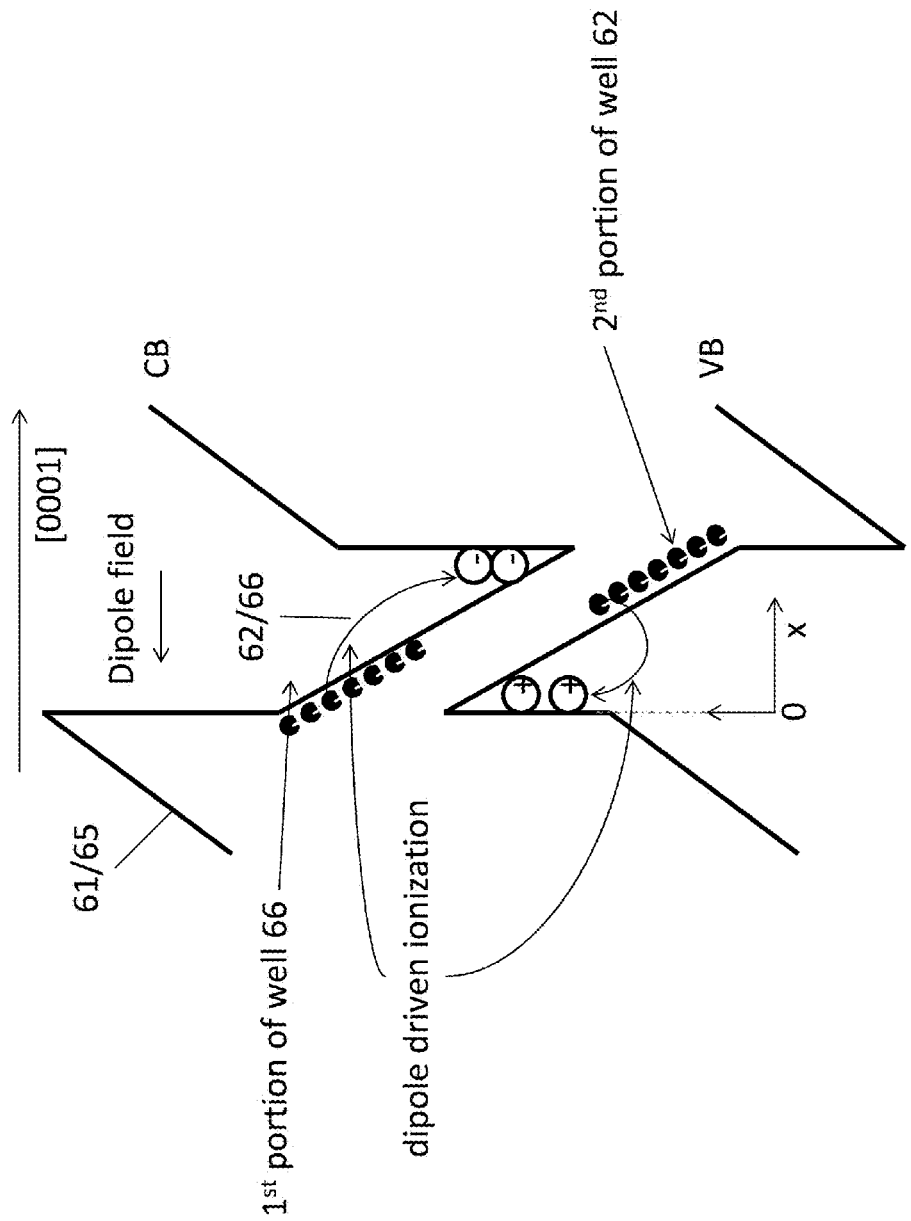

FIGS. 7A, 7B explain another principle used to form the AlGaN PN tunnel junctions according to the present invention.

Figure 8:
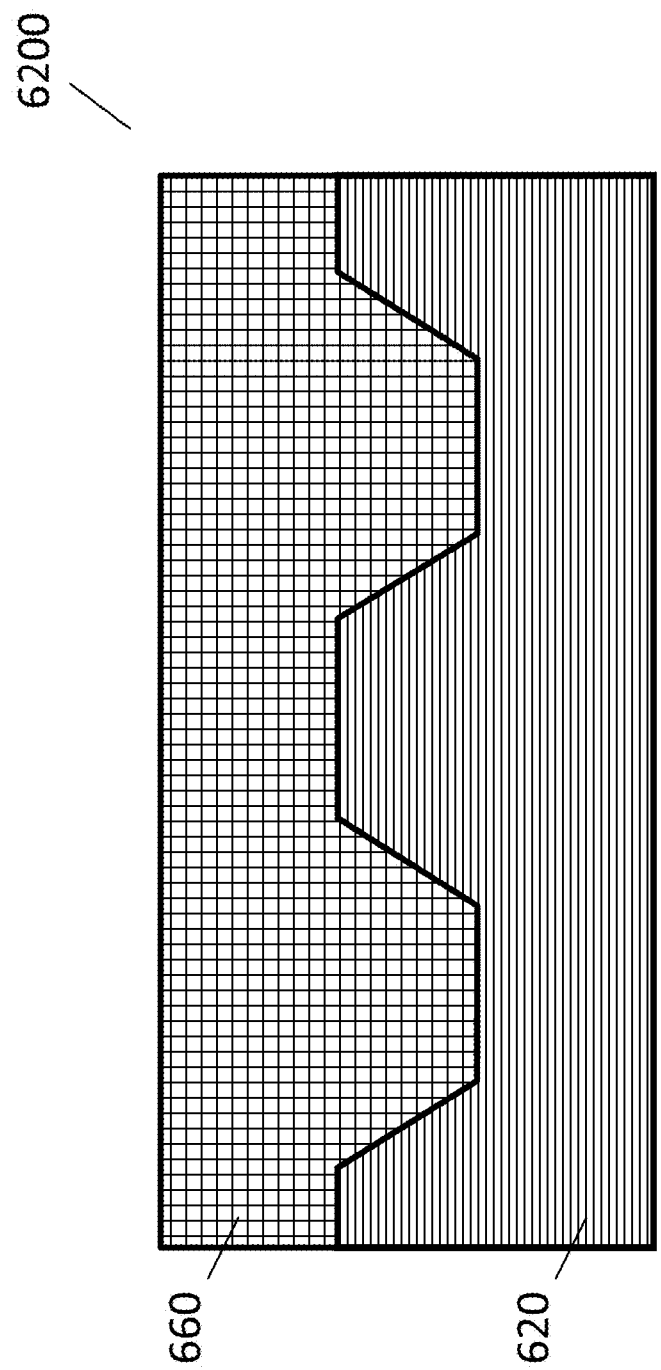

FIG. 8 illustrates a cross sectional schematic view of a PN tunnel junction formed according to an embodiment of the present invention.

Figure 9:
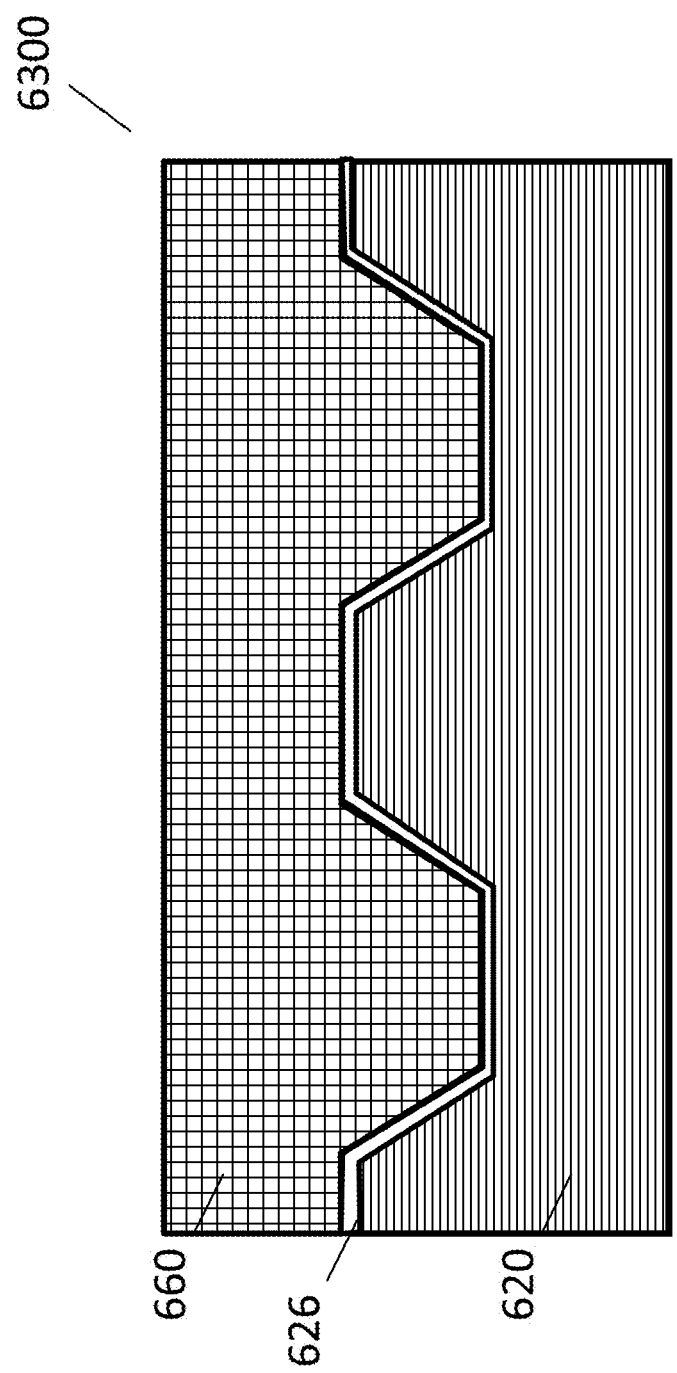

FIG. 9 illustrates a cross sectional schematic view of a PN tunnel junction formed according to an embodiment of the present invention.

Figure 10:
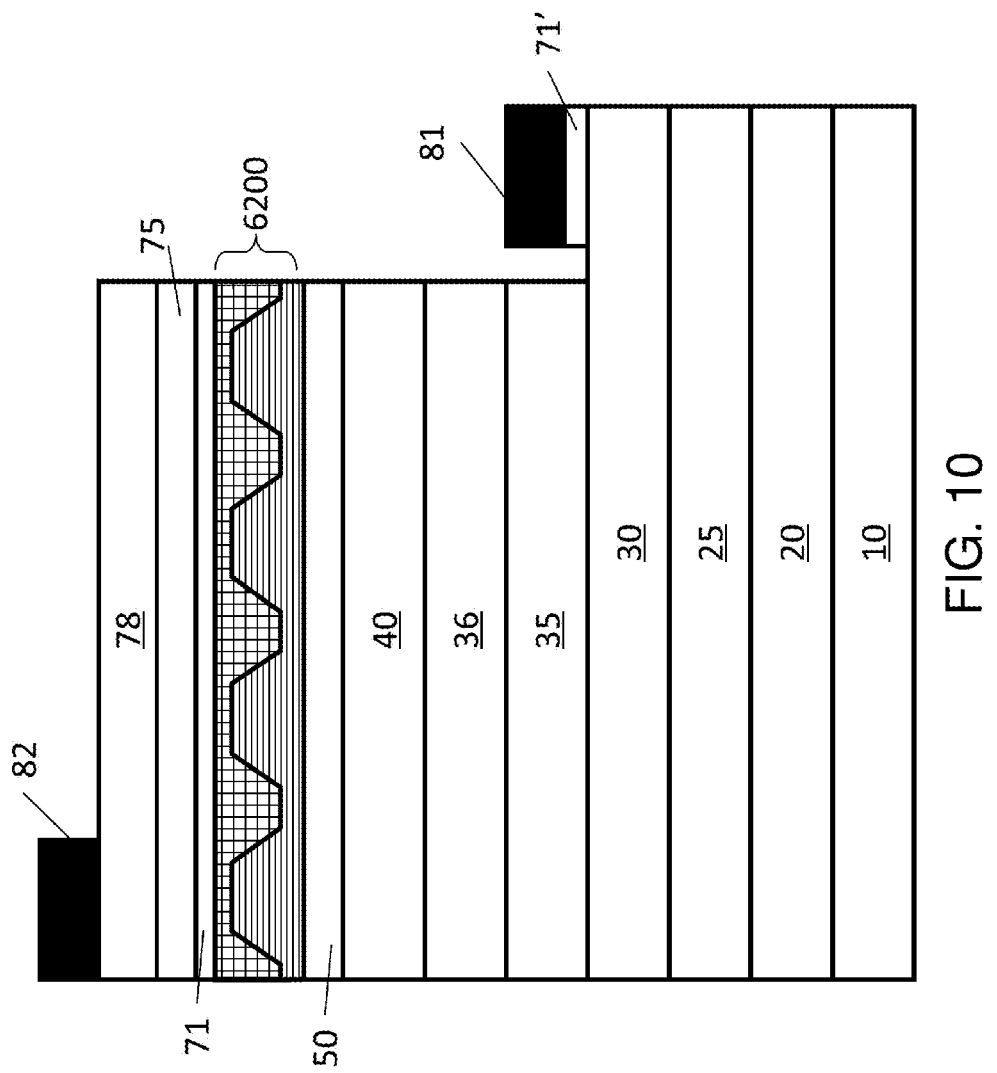

FIG. 10 illustrates a cross sectional schematic view of an AlGaN based UV LED utilizing the AlGaN PN tunnel junction formed according to the present invention.

Figure 11:
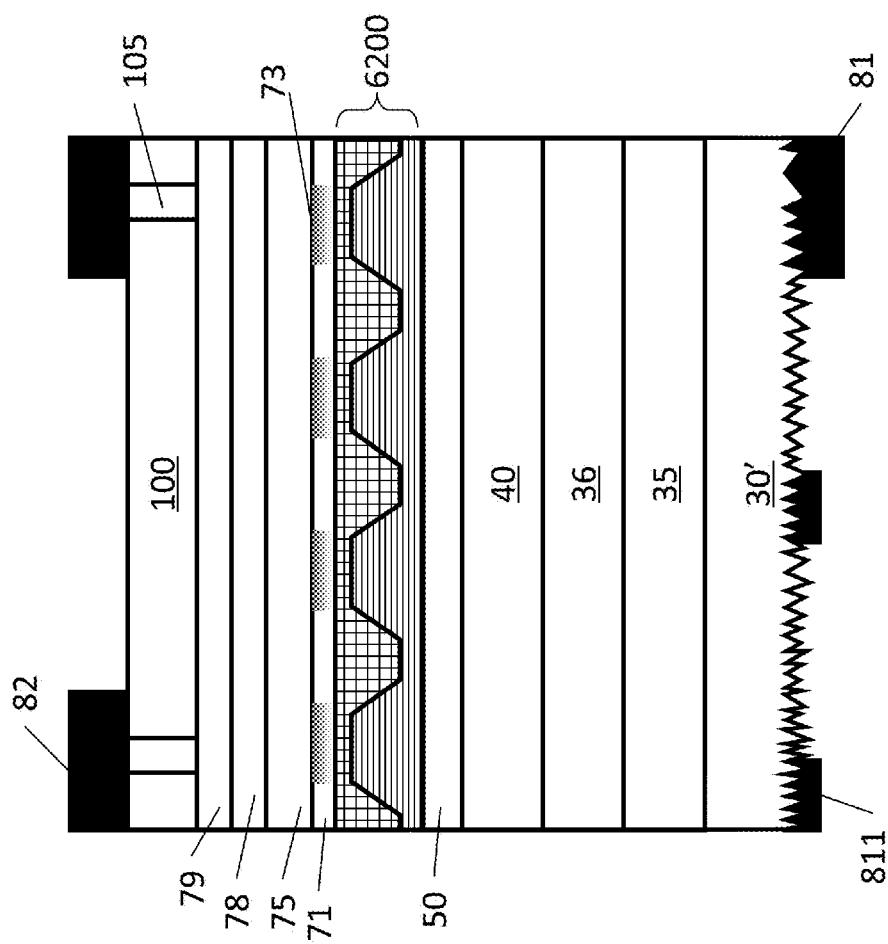

FIG. 11 illustrates a cross sectional schematic view of an AlGaN based UV LED utilizing the AlGaN PN tunnel junction formed according to the present invention.

5. DETAILED DESCRIPTION OF EMBODIMENTS

The present invention discloses UV transparent PN tunnel junction structures and light emitting devices incorporating such structures for improved light extraction efficiency. Throughout the specification, the term III-nitride or nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. III-nitride or nitride can also include small compositions of transition metal nitride such as TiN, ZrN, HfN with molar fraction not larger than 10%. For example, III-nitride or nitride may include Al$_x$In$_y$Ga$_z$Ti$_{(1-x-y-z)}$N, Al$_x$In$_y$Ga$_z$Zr$_{(1-x-y-z)}$N, Al$_x$In$_y$Ga$_z$Hf$_{(1-x-y-z)}$N, with (1-x-y-z)≤10%. A III-nitride layer or active-region means that the layer or active-region is made of III-nitride semiconductors.

In the following contents, wurtzite c-plane nitride light-emitting devices or structures are used as examples to elucidate the principle and spirit of the present invention. The teachings in this specification and given by the following embodiments can be applied to non-c-plane nitride semiconductors, II-VI semiconductors and other semiconductor devices.

Figure 1B:
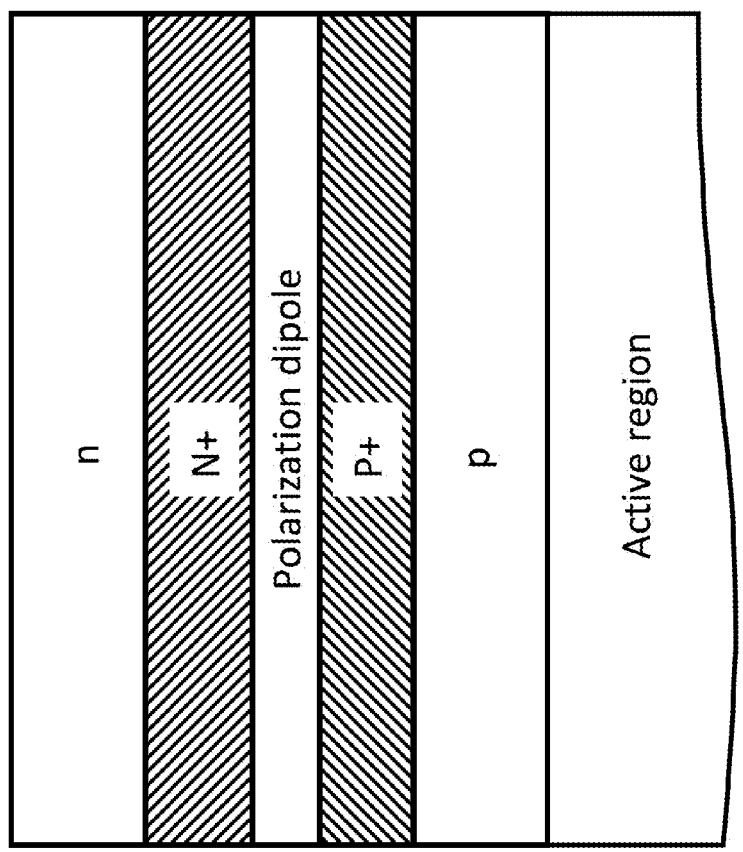
Figure 1C:
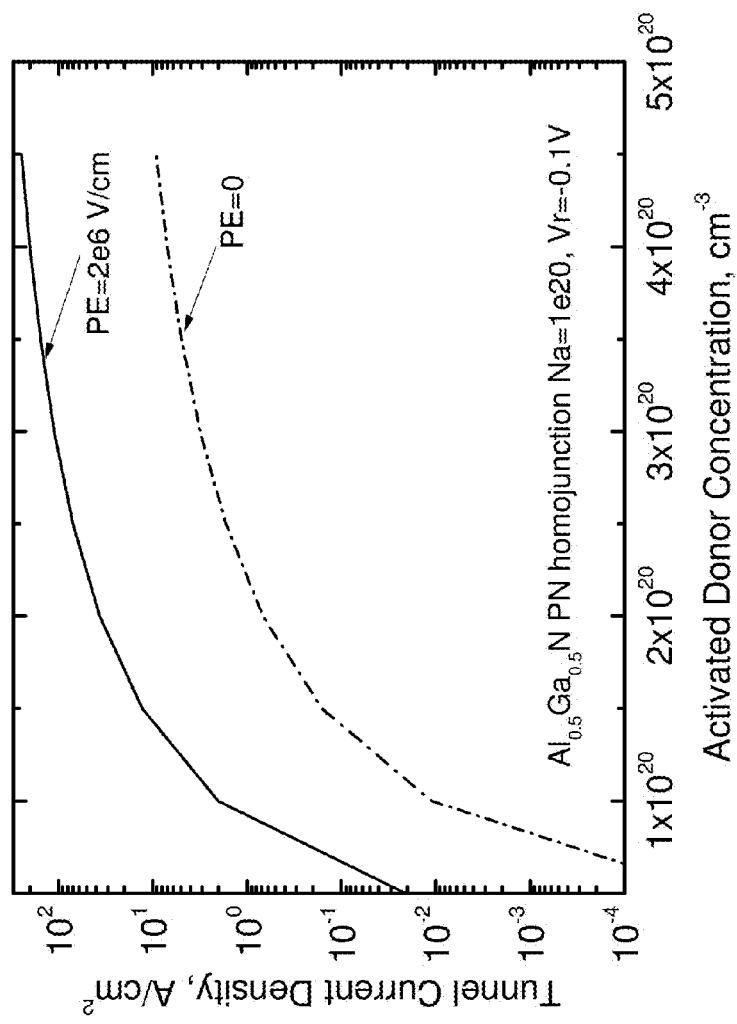
Figures 2, 2I:
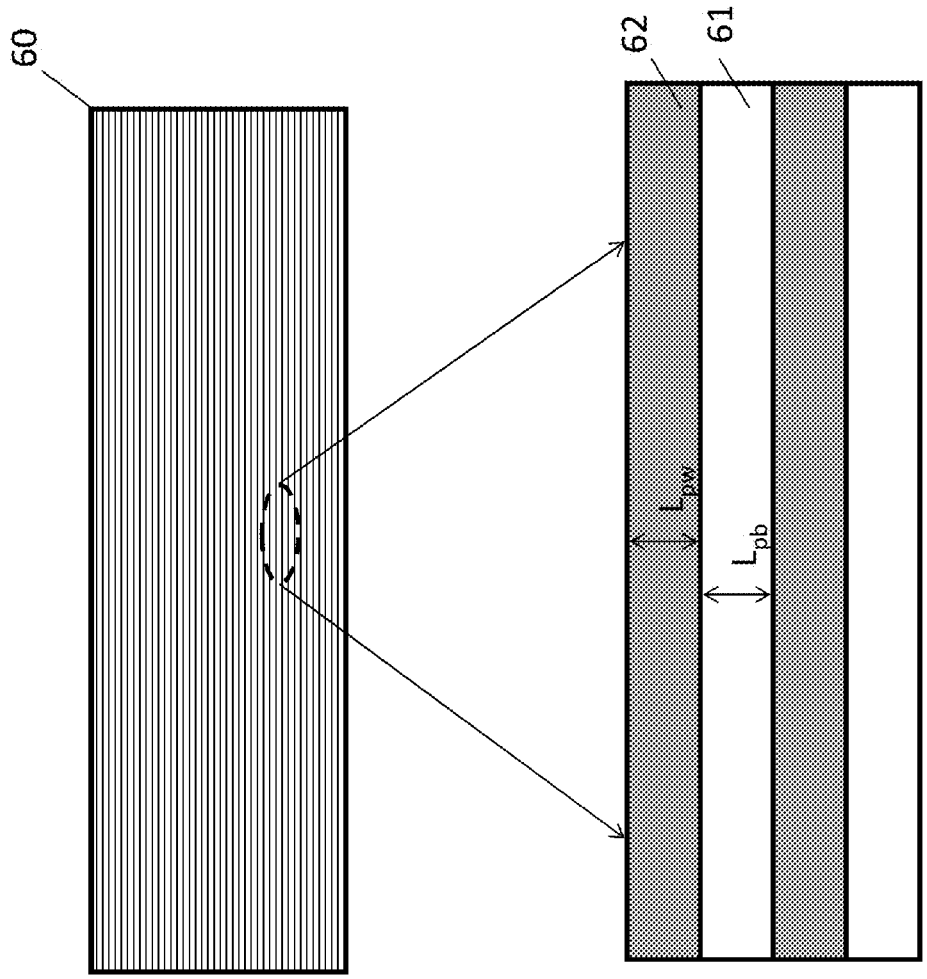
FIG. 2 illustrates a p-AlGaN structure used for PN tunnel junction formation according to an embodiment of the present invention.
FIG. 2i shows an enlarged part of the p-AlGaN structure shown in FIG. 2 to illustrate its detailed structure.

Illustrated in FIG. 2 is a p-AlGaN structure 60 according to an embodiment of the present invention, containing numerous alternating p-AlGaN barrier layer 61 and well layer 62, as shown in FIG. 2i for a zoomed-in illustration. Layers 61 and 62 have strong Al-composition contrast, yet maintaining structure 60 as a whole transparent for targeted UV emission wavelengths. The thicknesses of layers 61 and 62, $L_{pb}$ and $L_{pw}$, as well as doping configuration, follow certain rules according to the present invention as set forth in the following description. Structure 60 can be formed on any epitaxial growth template, for example, it can be formed in a UV LED structure right on the p-type electron blocking layer. The total thickness of structure 60 can be in, but not limited to, the range of 400-4000 nm, such as 500-3000 nm.

Figure 3A:
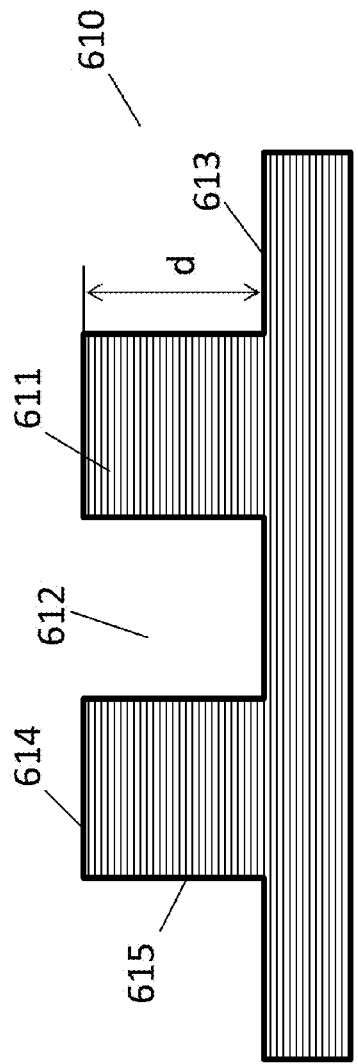
FIG. 3A illustrates a cross sectional schematic view of a textured p-type AlGaN structure made from the p-AlGaN structure shown in FIG. 2.
Figure 3B:
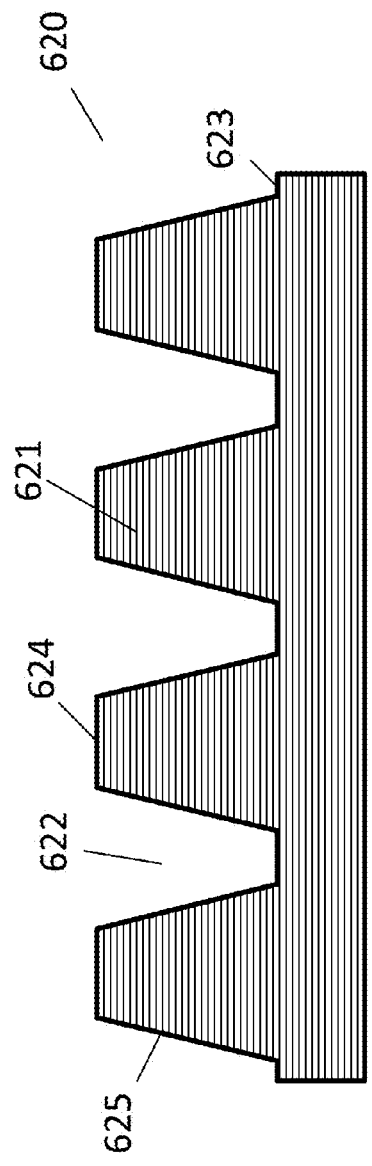
FIG. 3B illustrates a cross sectional schematic view of a textured p-type AlGaN structure made from the p-AlGaN structure shown in FIG. 2.
Figure 4A:
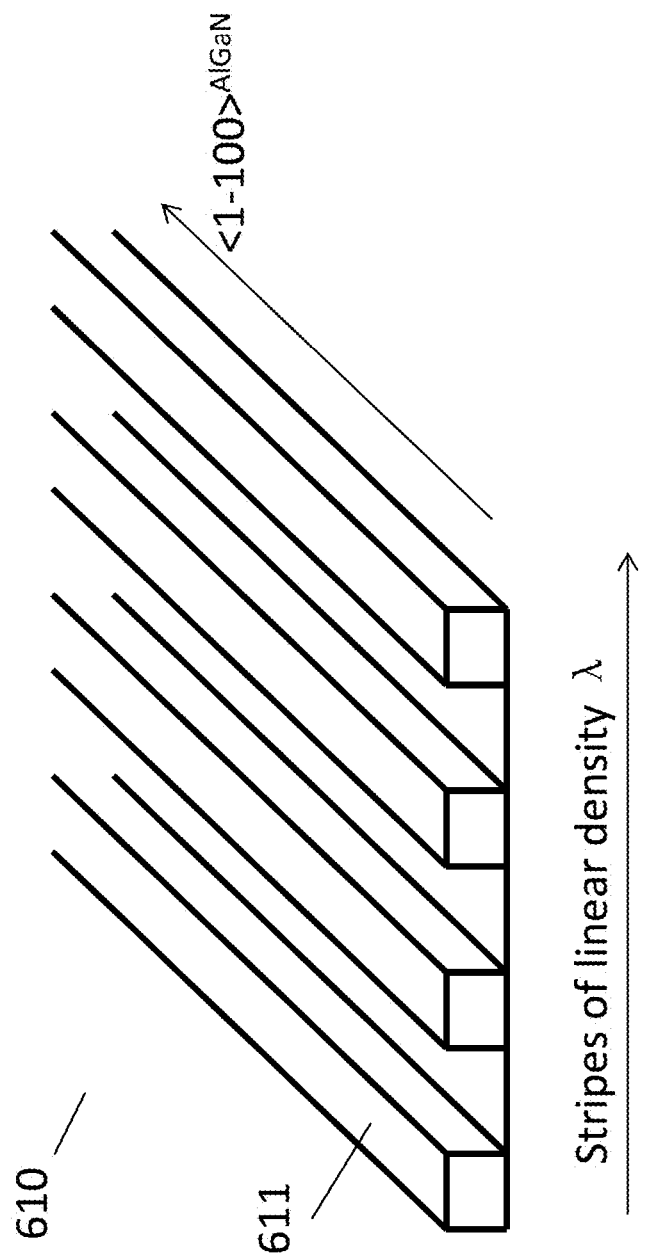
FIG. 4A illustrates a bird's eye view of a textured p-type AlGaN structure made from the p-AlGaN structure shown in FIG. 2.

In order for structure 60 to be part of a UV transparent PN tunnel junction, structure 60 may have certain surface texture. Shown in FIGS. 3A and 3B are the cross sectional schematic views of two textured structures 60, i.e., structures 610 and 620. Part of the material portions of structure 60 is removed to form structures 610 and 620. For structure 610, upon removal of part of material portions, stripe or pillar portions 611 remain, separated from each other by void portions 612. Portions 611 possess rather abrupt sidewalls 615. In a bird's eye view, portions 611 may have stripe shape, as illustrated in FIG. 4A. Preferably, these stripes are arranged in a regular pattern to allow high-quality AlGaN material epitaxial formation. For example, stripe portions 611 may lie along certain crystallographic direction. In some preferred embodiments, stripe portions 611 lie along the $<1\text{-}100>_{AlGaN}$ direction. When stripe portion 611 of a height d has a linear density of λ, the abrupt sidewalls 615 contribute to a surface area increase of 2dλ. For example, if d=0.5 μm, and λ=3000 cm$^{-1}$, the surface ratio of structure 610 to structure 60 is 1+2dλ=130%. Stripe height d is preferably in the range of 0.25 μm to 1.0 μm, for example, 0.3 μm to 0.6 μm. Stripe linear density is optionally within 2000-5000 cm$^{-1}$. Lateral size of stripe portion 611 can be in the range of 0.5 μm to 5.0 μm, such as in the range of 1.0 μm to 2.0 μm. The ratio of height d to the total thickness of structure 60 can be in the range of 0.4-0.95, such as 0.6-0.8.

In a bird's eye view, portions 611 may also have pillar shape, as illustrated in FIG. 4B. These pillars' sidewalls 615 are preferably to be aligned with crystallographic $<1\text{-}100>_{AlGaN}$ direction. If pillar 611 has an areal density of n, the abrupt sidewalls 615 contribute to a surface area increase of $2d\sqrt{n}$. For example, if d=0.5 μm, and n=10$^7$ cm$^{-2}$, the surface ratio of structure 610 to structure 60 is $1+2d\sqrt{n}=131.6\%$. Pillar areal density is optionally within $1\times10^6$-$1\times10^8$ cm$^{-3}$, and pillar lateral dimension in the range of 0.5 μm to 5.0 μm, such as in the range of 1.0 μm to 2.0 μm. Increase surface area (of structure 60 to structure 610) will benefit tunnel junction formation. In this sense, it is beneficial to transform structure 60 into structure 620. As shown in FIG. 3B, structure 620 with slanted sidewalls 625 will have much large surface area as compared to structures 60 and 610. The fabrication of structures 620/610 from structure 60 can be accomplished via semiconductor process steps including photolithography and wet or dry etching. The slant angle of sidewall 625 can be controlled by etching parameters, which can be in the range of 50-90°, such as 70-80°

N—AlGaN structures can be epitaxially formed on p-AlGaN structures 610 and 620 for PN tunnel junction formation. As shown in FIG. 5, FIG. 8 and FIG. 9 are PN tunnel junction structures 6100, 6200, and 6300, respectively made by forming n-AlGaN structure 650 on p-AlGaN structure 610 and n-AlGaN structure 660 on p-AlGaN structure 620. The n-AlGaN structures used to make these PN tunnel structures include numerous alternating n-AlInGaN, such as n-AlGaN or n-InGaN, barrier layer 65 and well layer 66, as shown in FIG. 5i. The difference between structures 6100 and 6200 is the respective sidewall angles of the forming n-AlGaN structures. And compared to structure 6200, the difference in structure 6300 is an addition of a layer 626 on structure 620 prior to the formation of structure 660. Layer 626 is a very thin layer of much smaller band gap and heavily doped with donor dopants. In some embodiments, layer 626 is a 0.8-1.0 nm InGaN layer of In-composition 15-20% with Si-doping concentration of 0.1-1.5×10$^{20}$ cm$^{-3}$.

In the PN tunnel junction structures formed according to the present invention, the tunnel junction forms at the sidewalls 615 or 625, in addition to that formed at the surfaces 613, 614/623, 624. Tunnel junctions formed at sidewalls have greater tunneling probability and tunnel current. This is understood with the principles illustrated in FIGS. 6, 7A, and 7B.

Referring to FIG. 6, p-AlGaN structures 610/620 is in side contact with n-AlGaN structures 650/660, i.e., at sidewalls 615, 625, p-AlGaN barrier layers 61 and well layers 62 are in side-by-side contact with n-AlGaN barrier layers 65 and well layers 66, with the corresponding barrier layers (61 and 65) heavily doped with acceptors and donors, and the corresponding well layers (62 and 66) optionally also doped with acceptors and donors, respectively. At sidewalls 615, 625, each p-AlGaN barrier layer 61 may be in side contact with an n-AlGaN barrier layer 65, or a well layer 66, or both. At sidewalls 615, 625, each p-AlGaN well layer 62 may be in side contact with an n-AlGaN barrier layer 65, or a well layer 66, or both. Heavy doping here means that the doping level is in excess of 10$^{19}$ cm$^{-3}$, for example, in the range of 5×10$^{19}$ cm$^{-3}$ to 5×10$^{20}$ cm$^{-3}$. Continuously heavily doping a layer up to a certain thickness (defined as heavy doping critical thickness in this specification) will result in crystallographic quality degradation, turning the otherwise shallow acceptors/donors into deep level impurities and leading to unionization of the dopants and high resistivity. According to this aspect of the present invention, heavy doping only takes place in the barrier layers (61 and 65), the well layers (62 and 66) may be doped not exceeding 5×10$^{18}$ cm$^{-3}$. Further, the barrier layers (61 and 65) have a limited thickness in the range of 0.5 to 10, or 3 to 10 nanometers, which is below the heavy doping critical thickness for the AlGaN barrier layers (61 and 65), depending on the barrier Al-composition according to the findings of the present inventors. To improve the p- and n-AlGaN structures quality, the undoped or lightly doped well layers ((62 and 66) may have an equal or larger thicknesses than those of the heavily doped barrier layers. Still to improve the p- and n-AlGaN structures quality, the heavy doping in the barrier layers (61 and 65) may be realized via multiple delta-doping, and co-doping. The total thickness of n-AlGaN structure 650/660 can be in, but not limited to, the range of 400-4000 nm, such as 500-3000 nm.

For p-type doping, Mg is the practically accepted acceptor dopant for III-nitride. In order to increase the p-AlGaN structures (mainly layer 61) p-type dopant concentration, O (oxygen) may be used as co-dopant for Mg. The co-dopant O accompanying acceptor Mg may have a concentration roughly about one hundredth of that of Mg. That is to say, when doping layers 61 with Mg in the range of $5 \times 10^{19}$ cm$^{-3}$ to $5 \times 10^{20}$ cm$^{-3}$, the co-dopant O may have a concentration in the range of $5 \times 10^{17}$ cm$^{-3}$ to $5 \times 10^{18}$ cm$^{-3}$.

For n-type doping, Si is the practically accepted donor dopant for III-nitride. In order to increase the n-AlGaN structures (mainly layers 65) n-type dopant concentration, Ge may also be used as donor dopant or co-dopant of Si. The preferred dopant concentration of layers 65 is in the range of $5 \times 10^{19}$ cm$^{-3}$ to $5 \times 10^{20}$ cm$^{-3}$.

Barrier layers 61 and 65 have a higher Al-composition than their corresponding well layers 62 and 66. The band gap offset is split into 60% for conduction band offset and 40% for valence band offset. According to embodiments of the present invention, barrier layers 61 at least have a valence band offset of 300 meV to that of the well layers 62. This means barrier layers 61 at least have 0.26 Al-composition more than that of adjacent well layers 62. For example, if well layer 62 has an Al-composition of 0.4, then adjacent barrier layer 61 should have Al-composition not less than 0.66. In one embodiment of the present invention, well layer 62 has an Al-composition of 0.5, and barrier layer 61 has an Al-composition 0.77.

Further according to this aspect of the present invention, barrier layers 65 at least have a conduction band offset of 200 meV to that of the well layers 66. This means barrier layers 65 at least have 0.12 Al-composition more than that of adjacent well layers 66. For example, if well layer 66 has an Al-composition of 0.4, then adjacent barrier layer 65 should have Al-composition not less than 0.52. In one embodiment of the present invention, well layer 66 has an Al-composition of 0.5, and barrier layer 61 has an Al-composition 0.64.

The band gap offset and hence the Al-composition selection rule according to this aspect of the present invention is to ensure that the dopants in the barrier layers are fully ionized and carriers are released into the corresponding well layers (band gap offset driven ionization). For example, when donor dopant concentration of layers 65 is in the range of $5 \times 10^{19}$ cm$^{-3}$ to $5 \times 10^{20}$ cm$^{-3}$, the Al-composition selection rule governing layers 65 and 66 ensures donors being fully ionized and electrons being released into layers 66, leaving fully ionized donor, D$^+$, in barrier layers 65. When acceptor dopant concentration of layers 61 is in the range of $5 \times 10^{19}$ cm$^{-3}$ to $5 \times 10^{20}$ cm$^{-3}$, the Al-composition selection rule governing layers 61 and 62 ensures acceptors being fully ionized and holes being released into layers 62, leaving fully ionized acceptor, A$^-$, in barrier layers 61.

When barrier layers 61/65 and well layers 62/66 form contact with each other, as illustrated in FIG. 6, free carriers, i.e., holes in layer 62 and electrons in layer 66, driven by entropic and static electric forces, recombine with each other, which in turn drives more donors and acceptors to ionize if there is any left in the barrier layers. This process produces very high concentration immobile negative and positive charges in the very vicinity, generating a maximal electric field greater than $1.2 \times 10^7$ V/cm. With this strong built-in electric field, when AlGaN PN tunnel junction structures (6100, 6200, 6300) formed according to this aspect of the present invention are under small reverse bias (i.e., 650/660 is positive biased regarding to 610/620), electrons in the valence band of layers 61 easily tunnel through PN junction and reach layers 65. This process is equal to injecting holes from layers 65 into layers 61. The total thickness of the AlGaN PN tunnel junction structure can be in, but not limited to, the range of 400-4000 nm, such as 500-3000 nm.

In summary, this aspect of the present invention utilizes the band gap offset driven ionization to physically separate dopants and carriers, which makes carriers (electrons and holes) more free of the static electric force from their dopants, hence leading to more efficient carrier recombination and in turn it drives more dopants to ionize, generating large built-in electric field between the ionized dopants. The built-in electric field is strong enough to make p-side valence band electrons tunnel to n-side conduction band.

In some other embodiments according to this aspect of the present invention, an AlGaN based PN tunnel junction structure 6100 includes a p-AlGaN structure 610, with barrier layers 61 of larger Al-composition and well layers 62 of smaller Al-composition to ensure a valence band offset not less than 300 meV as well as targeted UV emission transparency, an n-AlGaN structure 650, with barrier layers 65 made of AlGaN with Al-composition ranging from 0 to 0.6, for example, 0.05 to 0.4 and well layers 66 made of InGaN with In-composition ranging from 0 to 0.2, for example, 0.05 to 0.1 to ensure a conduction band offset not less than 200 meV. According to this embodiment, p-AlGaN structure 610 preferably contains stripe portions 611, and material portions of n-AlGaN structure 650 formed over surfaces 614 are removed away only with material portions filled in within void portions 612 remained.

In some other embodiments according to this aspect of the present invention, an AlGaN based PN tunnel junction structure 6200 includes a p-AlGaN structure 620, with barrier layers 61 of larger Al-composition and well layers 62 of smaller Al-composition to ensure a valence band offset not less than 300 meV as well as targeted UV emission transparency, an n-AlGaN structure 660, with barrier layers 65 made of AlGaN with Al-composition ranging from 0 to 0.6 and well layers 66 made of InGaN with In-composition ranging from 0 to 0.2 to ensure a conduction band offset not less than 200 meV. According to this embodiment, p-AlGaN structure 620 preferably contains stripe portions 621, and material portions of n-AlGaN structure 660 formed over surfaces 624 are removed away only with material portions filled in within void portions 622 remained.

These embodiments according to this aspect of the present invention may have reduced UV transparency but with enhanced tunnel current. When applying these AlGaN PN tunnel junction structure embodiments to light emitting devices (such as those shown in FIGS. 10, 11), n-contact layer 71 only forms on the material portions of structure 650, 660, UV mirrors (75 or 75 and 73) are formed on surfaces 614, 624.

According to still another aspect of the present invention, a second approach of forming AlGaN lateral tunnel junction structures is explained in FIGS. 7A and 7B. Here the barrier layers 61/65 are of substantially higher Al-compositions as compared to those of the well layers 62/66. For example, if well layers 62/66 are of Al-compositions of 0.4, barrier layers 61/65 will possess Al-compositions not less than 0.75, and if well layers 62/66 are of Al-compositions of 0.50, barrier layers 61/65 shall possess Al-compositions not less than 0.85, and so forth. In one embodiment, well layers 62/66 is of 0.5 Al-composition and barrier layers 61/65 is of 1.0 Al-composition, namely, barrier layers 61/65 are made of pure AlN. The large (0.35 and above) Al-composition difference is designed to generate well-barrier interface polarization charge of sheet density not less than $2 \times 10^{13}$ cm$^{-2}$. Further, according to this aspect of the present invention, barrier layers 61/65 are much thinner than well layers 62/66. The thickness of barrier layers 61/65 is preferably in the range of 0.5 nm to 3.0 nm, for example, in-between 1.0 nm and 2.0 nm. The thickness of well layer 62/66 is preferably in the range of 6.0 nm to 15 nm, for example, in-between 8 nm and 12 nm. The thickness of well layers 62 is preferably to be thicker than the thickness of well layers 66, for example, thicker more than 30%.

Referring to FIGS. 7A and 7B, the barrier/well interface polarization sheet charges produce a dipole pointing against [0001] direction (also the epitaxial direction). The dipole field causes band tilting in the well layers 62/66, which means carriers' (electrons and holes) energy are changing in the epitaxial formation direction, even though the carriers are confined within the same potential well. Referring to FIG. 7B, consider a hole's potential energy change as a function of position in the epitaxial direction within the well. It is caused by the dipole field, defined as $\Delta U_h(x_0)$, and $$\Delta U_h(x_0) = -\int_0^{x_0} q\vec{E}_{dipole} \cdot d\vec{x} = E_{dipole} x_0.$$

As hole carries a positive elementary charge, and the dipole field is against the epitaxial direction [0001], holes gain potential energy within the potential well as moving along the epitaxial direction. When $\Delta U_h(x_0) \geq E_A$, where $E_A$ is the acceptor ionization/activation energy, acceptors doped in the regions within $[x_0, L_{pw}]$ of well layers 62 will be ionized because of presence of the dipole field. In the following specifications, regions $[x_0, L_{pw}]$ of well layers 62 are defined as the second portion of well layers 62, and rest regions of well layers 62, i.e., $[0, x_0)$, are defined as the first portion of well layers 62.

For electrons, the case is opposite, electrons loss potential energy within the potential well as moving along the epitaxial direction. Similarly, one can define a point $x_0'$, at which the electron potential energy under the dipole field $\Delta U_e(x'_0) \leq E_D$, wherein $E_D$ is the donor ionization/activation energy. Donors doped in the region $[0, x_0']$ of well layers 66 will be ionized because of the dipole field and the regions $[0, x_0']$ of well layers 66 are defined as the first portion of well layers 66, and the rest regions, i.e., $(x_0', L_{nw}]$ of well layers 66 are defined as the second portion of well layers 66.

Since donor activation energy is much smaller than acceptor activation energy in AlGaN materials, the first portion of well layers 66 is much thicker than the second portion of well layers 62.

This means that the dipole field demands that holes are accumulated in well layers 62 near the left interface and electrons are accumulated in well layers 66 near the right interface, as illustrated in FIG. 7B.

As previously mentioned, acceptor ionization energy in AlGaN varies between 200 to 650 meV, depending on Al-composition. And acceptor ionization percentage is of inverse exponential proportion to the ratio of ionization energy and temperature thermal energy, which means that at room temperature the acceptor ionization/activation is trivial. However, if acceptor/donor dopants are doped in the strong dipole charged area, ionization can be greatly enhanced. Referring to the illustration shown in FIG. 7B, because of the strong dipole field, donor levels in the first portion (left portion) of well layers 66 is higher than the conduction band edge of the second portion (right portion) of well layers 66. This means that donors in the first portion of well layers 66 will release electrons to the conduction band of the second portion of well layers 66, realizing full ionization/activation of donors doped in the first portion of well layers 66 (dipole driven ionization). Similarly, by selecting large enough dipole field, acceptor levels in the second portion (right portion) of well layers 62 will be higher than the valence band edge of the first portion (left portion) of well layers 62, meaning that acceptors in the second portion of well layers 62 will release holes to the valence band of the first portion of well layers 62, realizing full ionization/activation of acceptors doped in the second portion of well layers 62.

When barrier layers 61/65 and well layers 62/66 form contact with each other, as illustrated in FIG. 7A, free carriers, i.e., holes in first portion of well layers 62 and electrons in second portion of well layers 66, driven by entropic and static electric forces, recombine with each other, which in turn drives more donors and acceptors to ionize if there is any left in the respective well layer portions. This process produces very high concentration immobile negative and positive charges in the very vicinity, generating a maximal electric field greater than $1.2 \times 10^7$ V/cm. With built-in electric field strong as such, when AlGaN PN tunnel junction structures (6100, 6200, 6300) formed according to this aspect of the present invention are under small reverse bias (i.e., 650/660 is positive biased regarding to 610/620), electrons in the valence band of layers 62 easily tunnels through PN junction and reach layers 66. This process is equal to injecting holes from layers 66 into layers 62.

In summary, this aspect of the present invention utilizes the dipole driven ionization to physically separate dopants and carriers, which makes carriers (electrons and holes) more free of the static electric force from their dopants, hence leading to more efficient carrier recombination and in turn it drives more dopants to ionize, generating large built-in electric field between the ionized dopants. The built-in electric field is strong enough to make p-side valence band electrons tunnel to n-side conduction band.

In some embodiments according to this aspect of the present invention, n-AlGaN structures (650 and 660) include 50-300 pairs of alternating AlGaN barrier layer 65 (2 nm-thick) and AlGaN well layer 66 (8 nm-thick), the Al-compositions of layers 65 and 66 are respectively 0.75 and 0.4. The first portion of well layers 66 is heavily doped with Si, and/or Ge to a doping level in the $1-2 \times 10^{20}$ cm$^{-3}$, and the second portion of well layer 66 is undoped or slightly doped with Si not exceeding $3 \times 10^{18}$ cm$^{-3}$, for example $1-2 \times 10^{18}$ cm$^{-3}$.

In some embodiments according to this aspect of the present invention, n-AlGaN structures (650 and 660) include 100-300 pairs of alternating AlGaN barrier layer 65 (1 nm-thick) and AlGaN well layer 66 (10 nm-thick), the Al-compositions of layers 65 and 66 are respectively 1.0 and 0.5. The first portion of well layers 66 is heavily doped with Si, and/or Ge to a doping level in the $1-2 \times 10^{20}$ cm$^{-3}$, and the second portion of well layer 66 is undoped or slightly doped with Si not exceeding $3 \times 10^{18}$ cm$^{-3}$, for example $1-2 \times 10^{18}$ cm$^{-3}$.

In some embodiments according to this aspect of the present invention, p-AlGaN structures (60, 610 and 620) include 50-300 pairs of alternating AlGaN barrier layer 61 (2 nm-thick) and AlGaN well layer 62 (8 nm-thick), the Al-compositions of layers 61 and 62 are respectively 0.8 and 0.4. The second portion of well layers 62 is heavily doped with Mg to a doping level in the $2-8 \times 10^{20}$ cm$^{-3}$, and the first portion of well layer 62 is undoped or slightly doped with Mg not exceeding $3 \times 10^{19}$ cm$^{-3}$, for example $1-2 \times 10^{19}$ cm$^{-3}$.

In some embodiments according to this aspect of the present invention, p-AlGaN structures (60, 610 and 620) include 100-300 pairs of alternating AlGaN barrier layer 61 (1 nm-thick) and AlGaN well layer 62 (9 nm-thick), the Al-compositions of layers 61 and 62 are respectively 1.0 and 0.4. The second portion of well layers 62 is heavily doped with Mg to a doping level in the $3-8 \times 10^{20}$ cm$^{-3}$, and the first portion of well layer 62 is undoped or slightly doped with Mg not exceeding $3 \times 10^{19}$ cm$^{-3}$, for example $1-2 \times 10^{19}$ cm$^{-3}$.

In some embodiments according to this aspect of the present invention, PN AlGaN tunnel junction structures (6100, 6200 and 6300) include 50-300 pairs of alternating AlGaN barrier layer 61 (2 nm-thick) and AlGaN well layer 62 (8 nm-thick), the Al-compositions of layers 61 and 62 are respectively 0.8 and 0.4. The second portion of well layers 62 is heavily doped with Mg to a doping level in the $2\text{-}8\times10^{20}$ cm$^{-3}$, and the first portion of well layer 62 is undoped or slightly doped with Mg not exceeding $3\times10^{19}$ cm$^{-3}$. The PN AlGaN tunnel junction structures further include 50-300 pairs of alternating AlGaN barrier layer 65 (2 nm-thick) and AlGaN well layer 66 (8 nm-thick), the Al-compositions of layers 65 and 66 are respectively 0.75 and 0.4. The first portion of well layers 66 is heavily doped with Si, and/or Ge to a doping level in the $1\text{-}2\times10^{20}$ cm$^{-3}$, and the second portion of well layer 66 is undoped or slightly doped with Si not exceeding $3\times10^{18}$ cm$^{-3}$, for example $1\text{-}2\times10^{18}$ cm$^{-3}$.

In some embodiments according to this aspect of the present invention, PN AlGaN tunnel junction structures (6100, 6200 and 6300) include 50-300 pairs of alternating AlGaN barrier layer 61 (1 nm-thick) and AlGaN well layer 62 (10 nm-thick), the Al-compositions of layers 61 and 62 are respectively 1.0 and 0.4. The second portion of well layers 62 is heavily doped with Mg to a doping level in the $2\text{-}8\times10^{20}$ cm$^{-3}$, and the first portion of well layer 62 is undoped or slightly doped with Mg not exceeding $3\times10^{19}$ cm$^{-3}$. The PN AlGaN tunnel junction structures further include 50-300 pairs of alternating AlGaN barrier layer 65 (1 nm-thick) and AlGaN well layer 66 (10 nm-thick), the Al-compositions of layers 65 and 66 are respectively 1.0 and 0.4. The first portion of well layers 66 is heavily doped with Si, and/or Ge to a doping level in the $1\text{-}2\times10^{20}$ cm$^{-3}$, and the second portion of well layer 66 is undoped or slightly doped with Si not exceeding $3\times10^{18}$ cm$^{-3}$.

According to still another aspect of the present invention, PN AlGaN tunnel junction structures (6100, 6200 and 6300) can be employed into UV LED structures. Illustrated in FIGS. 10 and 11 are cross-sectional schematic views of two UV LED structures according to this aspect of the present invention. Shown in FIG. 10 is a lateral UV LED structure. The structure starts with a UV transparent substrate 10. Substrate 10 can be selected from sapphire, AlN, SiC, and the like. Formed over substrate 10 is a template 20, which can be made of a thick AlN layer, for example, with a thickness of 0.33.0 µm. A strain management layer 25 is formed over template 20. It can be an AlN/AlGaN superlattice, or an Al-composition grading AlGaN layer. Following strain management layer 25 is a thick n-AlGaN layer 30 for electron supplier and ohmic contact formation (contacting to n-contact layer 71'), for example, with a thickness of 2.0-5.0 µm. Layer 35 formed over layer 30 is a heavily n-type doped AlGaN layer used for MQW active-region polarization field screening, and layer 36 formed over layer 35 is a lightly doped n-AlGaN layer with a dopant level of $5\times10^{17}\text{-}2\times10^{18}$ cm$^{-3}$ for current spreading, preparing uniform current injection into the following AlGaN/AlGaN MQW active-region 40. Layers 35 and 36 are usually of thickness not more than 200 nm, for example, 50-150 nm. An electron blocking p-AlGaN layer 50 which caps MQW active-region 40 is followed by a UV transparent AlGaN PN tunnel junction structure 6200. It is noted that the p-side of structure 6200 is in contact with p-AlGaN electron blocking layer 50 and the n-side of structure 6200 is in contact with n-contact layer 71. N-contact layer 71 (and 71') can be made of very thin metal layer stacks such as titanium/aluminum/titanium/gold (Ti/Al/Ti/Au) with respective layer thickness of 30-40/70-80/10-20/80-100 nanometers, for example 35/75/15/90 nanometers and it is in ohmic contact with the n-side of structure 6200. A metal mirror 75 of high UV reflectivity follows n-contact layer 71. Metal mirror 75 can be made of Al, which has the highest UV reflectivity. Covering metal mirror 75 is a thick metal contact layer 78, which can be made of gold or gold alloys for current spreading. Finally, two metal contact pads 81, 82 are formed for external electrical connection. When applying a positive bias to contact pad 82 relative contact pad 81, electrons in the valence band of structure 620 of PN tunnel junction structure 6200 tunnel through the tunnel junction to reach conduction band of structure 660 of structure 6200, leading to hole injection to structure 620 and hence providing hole injection into MQW active-region 40. UV LEDs made according to FIG. 10 are UV transparent. UV light traveling upwards will be reflected by metal mirror 75, so the UV emission will be extracted through the transparent substrate. A patterned transparent substrate such as pattern sapphire substrate will enhance the UV light extraction.

FIG. 11 illustrates the cross-sectional schematic view of a vertical thin film UV LEDs according to the present invention. As can be seen, substrate 10 and layers 20 and 25 are removed away, and thick n-AlGaN layer 30 is exposed and roughen to be layer 30' for enhanced light extraction. Further, the structure is bonded to a superstrate 100 via wafer bonding layer 79. Superstrate 100 may be a conductive metal wafer, such as Cu, or Cu—W alloy wafer. Bonding layer 79 bonds epilayers to superstrate 100, providing mechanical bonding and thermal and electrical conductance. Superstrate 100 may optionally be made of electrical insulating but super thermal conducting materials. In this case, electrical through-vias 105 are needed.

To enhance mirror 75's UV reflectivity, highly UV transparent dielectric layer 73 is employed as shown in FIG. 11. Layer 73 plus mirror 75 forms an omnidirectional reflector (ODR), with UV reflectivity greater than 88%, for example, equal to or larger than 92%. Layer 73 can be made by UV transparent low-refractive-index materials, such as $SiO_2$, $AlF_3$, $CaF_2$, $MgF_2$, et al. UV transparent dielectric layer 73 including a plurality of isolated portions is embedded in the n-contact layer 71 and exposed or in direct contact with the metal mirror 75. UV transparent dielectric layer 73 may or may not be exposed or in direct contact with the n-side of the PN tunnel junction structure 6200.

The UV LED embodiments made according to the present invention will have superior light extraction efficiency as compared to the prior art UV LEDs.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. An ultraviolet light-emitting device with a lateral tunnel junction for hole injection comprising:
    an n-type layer;
    a p-type layer;
    an active region sandwiched between the n-type layer and the p-type layer; and
    a PN tunnel junction structure formed on the p-type layer, the PN tunnel junction structure comprising:
    a p-type structure including a plurality of alternately laminated p-AlGaN barrier layers and p-AlGaN well layers, and an n-type structure including a plurality of alternately laminated n-AlGaN barrier layers and n-AlInGaN well layers, with the p-type structure facing the p-type layer;

wherein the p-AlGaN barrier layers have a larger Al-composition than that of the p-AlGaN well layers to ensure a valence band offset therebetween not less than 300 meV, the n-AlGaN barrier layers have a larger Al-composition than that of the n-AlInGaN well layers to ensure a conduction band offset therebetween not less than 200 meV;

wherein the p-AlGaN barrier layers and the n-AlGaN barrier layers are respectively doped with acceptors and donors of a dopant concentration in the range of $5\times10^{19}$ cm$^{-3}$ to $5\times10^{20}$ cm$^{-3}$;

wherein the p-type structure has a plurality of projections extending from its surface, each of the projections contains numerous alternately laminated p-AlGaN barrier layers and p-AlGaN well layers with edges of the p-AlGaN barrier layers and the p-AlGaN well layers being exposed by sidewalls of the projections;

wherein the n-type structure has a plurality of projections extending from its surface, each of the projections contains numerous alternately laminated n-AlGaN barrier layers and n-AlInGaN well layers with edges of the n-AlGaN barrier layers and the n-AlInGaN well layers being exposed by sidewalls of the projections;

wherein the n-type structure is formed on the p-type structure with the projections of the n-type structure fully filling void portions of the p-type structure, wherein the void portions of the p-type structure are defined by and surround the projections of the p-type structure.

2. The ultraviolet light-emitting device of claim 1, wherein the Al-composition of the p-AlGaN barrier layers is at least 0.26 more than that of the adjacent p-AlGaN well layers, the Al-composition of the n-AlGaN barrier layers is at least 0.12 more than that of the adjacent n-AlInGaN well layers.

3. The ultraviolet light-emitting device of claim 2, wherein the Al-composition of the p-AlGaN barrier layers is in the range of 0.66-0.8, the Al-composition of the p-AlGaN well layers is in the range of 0.4-0.5, the Al-composition of the n-AlGaN barrier layers is in the range of 0.52-0.7, and the Al-composition of the n-AlInGaN well layers is in the range of 0.4-0.5, and the thickness of each of the p-AlGaN barrier layers and the n-AlGaN barrier layers is in the range of 3-10 nm.

4. The ultraviolet light-emitting device of claim 2, wherein the Al-composition of the p-AlGaN barrier layers is in the range of 0.75-1 and at least 0.35 more than that of the adjacent p-AlGaN well layers which is in the range of 0.4-0.65, the Al-composition of the n-AlGaN barrier layers is in the range of 0.75-1 and at least 0.35 more than that of the adjacent n-AlInGaN well layers which is in the range of 0.4-0.65.

5. The ultraviolet light-emitting device of claim 4, wherein the thickness of each of the p-AlGaN barrier layers and the n-AlGaN barrier layers is in the range of 0.5-3 nm, and the thickness of each of the p-AlGaN well layers and the n-AlInGaN well layers is in the range of 6-15 nm.

6. The ultraviolet light-emitting device of claim 5, wherein the p-type structure contains 50-300 pairs of the p-AlGaN barrier layers and the p-AlGaN well layers, the n-type structure contains 50-300 pairs of the n-AlGaN barrier layers and the n-AlInGaN well layers.

7. The ultraviolet light-emitting device of claim 6, wherein a height of the projections of the p-type structure is 60-95% of a total thickness of the p-type structure, a height of the projections of the n-type sub-structure is 60-100% of a total thickness of the n-type structure.

8. The ultraviolet light-emitting device of claim 1, wherein the projections of the p-type structure have a stripe-shape and are arranged in a parallel lying along <1-100>$_{AlGaN}$ direction.

9. The ultraviolet light-emitting device of claim 1, wherein the projections of the p-type structure have a stripe-shape, a height of the stripe-shaped projections is in the range of 0.25-1.0 μm, a linear density of the strip-shaped projections is in the range of 2000-5000 cm$^{-1}$, a lateral size of the strip-shaped projections is in the range of 0.5-2.0 μm.

10. The ultraviolet light-emitting device of claim 1, wherein a second portion of the p-AlGaN well layers is doped with Mg to a doping level in the range of $2-8\times10^{20}$ cm$^{-3}$, and a first portion of the p-AlGaN well layers is undoped or slightly doped with Mg not exceeding $3\times10^{19}$ cm$^{-3}$.

11. The ultraviolet light-emitting device of claim 1, wherein a first portion of the n-AlInGaN well layers is doped with Si, and/or Ge to a doping level in the range of $1-2\times10^{20}$ cm$^{-3}$, and a second portion of the n-AlInGaN well layers is undoped or slightly doped with Si not exceeding $3\times10^{18}$ cm$^{-3}$.

12. The ultraviolet light-emitting device of claim 1, wherein the Al-composition of the p-AlGaN barrier layers is at least 0.26 more than that of the adjacent p-AlGaN well layers, the Al-composition of the n-AlGaN barrier layers is in the range of 0-0.6, the n-AlInGaN well layers are InGaN layers with an In-composition in the range of 0.05-0.2.

13. The ultraviolet light-emitting device of claim 1, wherein the thickness of each p-AlGaN barrier layer and each n-AlGaN barrier layer is in the range of 0.5-10 nm.

14. The ultraviolet light-emitting device of claim 1, wherein an InGaN layer is formed between the p-type structure and the n-type structure, the InGaN layer has a thickness in the range of 0.8-1.0 nm, an In-composition in the range of 0.15-0.2, and a Si-doping concentration of $0.1-1.5\times10^{20}$ cm$^{-3}$.

15. The ultraviolet light-emitting device of claim 1, wherein a thickness of the PN tunnel junction structure in device growth direction is in the range of 400-4000 nanometers.

16. The ultraviolet light-emitting device of claim 1, further comprising:
   an n-AlGaN layer for electron supplier;
   a heavily doped n-AlGaN layer for active-region polarization field screening, which is formed over the n-AlGaN layer for electron supplier, wherein the n-type layer is a lightly doped n-AlGaN layer for current spreading and formed over the heavily doped n-AlGaN layer for active-region polarization field screening, wherein the p-type layer is an electron blocking p-AlGaN layer formed over the active-region;
   an n-contact layer is formed on and in ohmic contact with an n-side of the PN tunnel junction structure;
   a metal mirror formed over the n-contact layer; and
   a metal contact layer formed over the metal mirror.

17. The ultraviolet light-emitting device of claim 16, further comprising a UV transparent dielectric layer which is embedded in the n-contact layer and exposed to the metal mirror, and the UV transparent dielectric layer and the metal mirror form an omnidirectional reflector.

18. A method for manufacturing an ultraviolet light-emitting device with a lateral tunnel junction for hole injection comprising:
   providing a substrate;
   forming an n-type layer over the substrate;
   forming an active region over the n-type layer;
   forming a p-type layer over the active region; and forming a PN tunnel junction structure on the p-type layer, wherein forming the PN tunnel junction structure includes:

forming a p-type structure on the p-type layer, the p-type structure including a plurality of alternately laminated p-AlGaN barrier layers and p-AlGaN well layers, and forming an n-type structure on the p-type structure, the n-type structure including a plurality of alternately laminated n-AlGaN barrier layers and n-AlInGaN well layers;

wherein the p-AlGaN barrier layers have a larger Al-composition than that of the p-AlGaN well layers to ensure a valence band offset therebetween not less than 300 meV, the n-AlGaN barrier layers have a larger Al-composition than that of the n-AlInGaN well layers to ensure a conduction band offset therebetween not less than 200 meV;

wherein the p-AlGaN barrier layers and the n-AlGaN barrier layers are respectively doped with acceptors and donors of a dopant concentration in the range of $5 \times 10^{19}$ cm$^{-3}$ to $5 \times 10^{20}$ cm$^{-3}$;

wherein the p-type structure has a plurality of projections extending from its surface, each of the projections contains numerous alternately laminated p-AlGaN barrier layers and p-AlGaN well layers with edges of the p-AlGaN barrier layers and the p-AlGaN well layers being exposed by sidewalls of the projections;

wherein the n-type structure has a plurality of projections extending from its surface, each of the projections contains numerous alternately laminated n-AlGaN barrier layers and n-AlInGaN well layers with edges of the n-AlGaN barrier layers and the n-AlInGaN well layers being exposed by sidewalls of the projections;

wherein the n-type structure is formed on the p-type structure with the projections of the n-type structure fully filling void portions of the p-type structure, wherein the void portions of the p-type structure are defined by and surround the projections of the p-type structure.

* * * * *